United States Patent
Todorova et al.

(10) Patent No.: US 12,015,427 B2
(45) Date of Patent: Jun. 18, 2024

(54) PHOTODIODE CURRENT COMPATIBLE INPUT STAGE FOR A SIGMA-DELTA ANALOG-TO-DIGITAL CONVERTER

(71) Applicant: STMicroelectronics (Research & Development) Limited, Marlow (GB)

(72) Inventors: Ilina Todorova, Sofia (BG); Jeffrey M. Raynor, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 164 days.

(21) Appl. No.: 17/713,514

(22) Filed: Apr. 5, 2022

(65) Prior Publication Data

US 2023/0318619 A1    Oct. 5, 2023

(51) Int. Cl.
*H03M 1/12*     (2006.01)
*H03M 3/00*     (2006.01)

(52) U.S. Cl.
CPC ........... *H03M 3/464* (2013.01); *H03M 3/462* (2013.01); *H03M 3/498* (2013.01)

(58) Field of Classification Search
CPC .......... H03M 3/43; H03M 3/39; H03M 3/364; H03M 3/424; H03M 3/456; H03M 3/464; H03M 3/496; H03M 1/1038; H03M 1/12; H03M 1/141; H03M 1/167; H03M 1/46; H03M 1/52; H03M 1/806; H03M 3/30; H03M 3/328; H03M 3/332; H03M 3/34; H03M 3/356; H03M 3/37; H03M 3/388; H03M 3/396; H03M 3/422; H03M 3/428; H03M 3/45; H03M 3/454; H03M 3/458; H03M 3/462; H03M 3/472; H03M 3/474; H03M 3/494

USPC ................. 341/143, 122, 155, 172
See application file for complete search history.

(56) References Cited

U.S. PATENT DOCUMENTS

| 4,439,756 | A | | 3/1984 | Shenoi et al. | |
|---|---|---|---|---|---|
| 4,851,841 | A | * | 7/1989 | Sooch | H03M 3/488 375/247 |
| 5,461,381 | A | | 10/1995 | Seaberg | |
| 5,659,314 | A | * | 8/1997 | Tokura | H03M 3/43 341/172 |
| 5,729,232 | A | * | 3/1998 | Fujimori | H03M 3/35 341/172 |

(Continued)

FOREIGN PATENT DOCUMENTS

DE    102014105880 A1    10/2014

OTHER PUBLICATIONS

Analog Devices, CN0312: "Dual-Channel Colorimeter With Programmable Gain Transimpedance Amplifiers and Synchronous Detectors," Jan. 1, 2021, 14 pages.

(Continued)

*Primary Examiner* — Linh V Nguyen
(74) *Attorney, Agent, or Firm* — Crowe & Dunlevy LLC

(57) ABSTRACT

An input stage circuit for a sigma-delta analog-to-digital converter circuit receives a digital-to-analog converter generated feedback signal and an analog current input signal to generate a difference signal applied to an integrator circuit. A single bit quantization circuit quantizes an output of the integrator circuit to generate a bit signal that is applied to an input of the digital-to-analog converter. The input stage circuit includes a switched input capacitor controlled by first and second, non-overlapping, clock signals.

29 Claims, 10 Drawing Sheets

(56) References Cited

U.S. PATENT DOCUMENTS

| | | | |
|---|---|---|---|
| 6,473,018 B2* | 10/2002 | Ueno | H03M 3/494 |
| | | | 341/157 |
| 6,501,322 B1 | 12/2002 | Bidenbach et al. | |
| 7,164,379 B1* | 1/2007 | Rao | H03M 1/52 |
| | | | 341/161 |
| 7,230,555 B2 | 6/2007 | Dolazza et al. | |
| 7,969,491 B2* | 6/2011 | Mizuno | G01J 1/46 |
| | | | 348/308 |
| 8,097,853 B2 | 1/2012 | Ji et al. | |
| 8,217,815 B2* | 7/2012 | Chen | H03M 3/474 |
| | | | 341/172 |
| 8,451,051 B2* | 5/2013 | Chen | H03M 3/396 |
| | | | 327/554 |
| 9,264,643 B1* | 2/2016 | Xue | H04N 25/75 |
| 9,432,049 B2* | 8/2016 | Katayama | H03M 3/496 |
| 9,451,189 B2 | 9/2016 | Wakabayashi et al. | |
| 9,661,251 B1 | 5/2017 | Eshel et al. | |
| 9,859,916 B1* | 1/2018 | Verdant | H03M 3/50 |
| 10,128,866 B2 | 11/2018 | Tkachev | |
| 10,581,451 B2 | 3/2020 | Venkataraman et al. | |
| 10,862,492 B1 | 12/2020 | Huynh | |
| 11,043,961 B2* | 6/2021 | Ng | H03M 1/806 |
| 2007/0171118 A1 | 7/2007 | Onishi | |
| 2010/0208114 A1* | 8/2010 | Kwon | H04N 25/00 |
| | | | 348/308 |
| 2014/0001341 A1* | 1/2014 | Hassibi | H03F 3/08 |
| | | | 250/208.2 |
| 2021/0164834 A1 | 6/2021 | Wu | |
| 2021/0351768 A1 | 11/2021 | Fan et al. | |
| 2021/0377470 A1 | 12/2021 | Malone et al. | |
| 2022/0329256 A1* | 10/2022 | Kanagal Ramesh | H03M 1/66 |

OTHER PUBLICATIONS

Dei, Michele, et al: "A Robust 96.6-dB-SNDR 50-kHz-Bandwidth Switched-Capacitor Delta-Sigma Modulator for IR Imagers in Space Instrumentation," Sensors 2017, 17, 1273: doi:10.3390/sl7061273, Jun. 2, 2017, 19 pgs.

Lee, Ilseop, et al: "A Low-Power Incremental Delta-Sigma ADC for CMOS Image Sensors," IEEE Transactions on Circuits and Systems—II: Express Briefs, vol. 63, No. 4, Apr. 2016, pp. 371-375.

Nahtigal, Uros, et al: "A Low Power, High Resolution, Sigma-Delta A/D Converter for an Ambient Color Light Sensor," Conference Paper, Oct. 2014, 6 pages.

Yeknami, Ali Fazli, et al: "A 0.3V Biofuel-Cell-Powered Glucose/Lactate Biosensing System Employing a 180nW 64dB SNR Passive $\Delta\Sigma$ ADC and a 920MHz Wireless Transmitter," ISSCC 2018, Session 17, Technologies for Health and Society, 17.3, pp. 284-286.

\* cited by examiner

PHOTODIODE CURRENT COMPATIBLE INPUT STAGE FOR A SIGMA-DELTA ANALOG-TO-DIGITAL CONVERTER

TECHNICAL FIELD

The present invention generally relates to interface circuits and, in particular, to an input stage for interfacing current output from a photodiode to a sigma-delta (SD) analog-to-digital converter (ADC) circuit.

BACKGROUND

FIG. 1 shows a time domain block diagram of a conventional sigma-delta (SD) analog-to-digital converter (ADC) circuit 10. The circuit 10 includes a sigma-delta modulator circuit 12 (illustrated here as a first-order circuit) having an input configured to receive an analog input signal A and an output configured to generate a digital output signal B comprised of a pulse density modulated pulse stream of 1-bit codes. The ratio formed by a count of the number of pulses in the pulse stream of the signal B divided by a total number of samples (set by a sampling clock at a sampling rate Kfs) of the input signal A over a known time interval represents the instantaneous magnitude of the input signal A. The circuit 10 further includes a decimator circuit 14 that accumulates and averages the pulses in the pulse stream of the digital output signal B to generate a digital signal C comprised of a stream of multi-bit (M-bit, where M»1) digital words at an output word rate fd, where fd«Kfs, set by a decimation factor.

The first order implementation of the sigma-delta modulator circuit 12 comprises a difference amplifier 20 (or summation circuit) having a first (non-inverting) input that receives a buffered 18 analog voltage input signal A from a voltage source and a second (inverting) input that receives an analog voltage feedback signal D from a feedback loop. The buffer circuit 18 provides a high impedance input to ensure that the voltage level of the analog voltage input signal A does not drop due to the divider effect. The difference amplifier 20 outputs an analog voltage difference signal vdif in response to a difference between the analog voltage input signal A and the analog voltage feedback signal D (i.e., vdif(t)=A(t)−D(t)). The analog voltage difference signal vdif is integrated by an integrator circuit 22 (a first order loop filter) to generate a change signal vint having a slope and magnitude that is dependent on the sign and magnitude of the analog voltage difference signal vdif. A comparator circuit 24 samples the change signal vint in response to a sampling clock at the sampling rate Kfs and compares the voltage of each sample of the change signal vint to a reference voltage signal vref to generate a corresponding single bit that is latched by a D-type flip flop 26 at the frequency of a clock signal CLK to output a single bit pulse of the digital output signal B (where the single bit has a first logic state if vint≥vref and has a second logic state if vint<vref). The comparator circuit 24 effectively operates as a single bit quantization circuit for quantizing the change signal vint. A single bit digital-to-analog converter (DAC) circuit 28 in the feedback loop then converts the logic state of the digital output signal B to a corresponding analog voltage signal level (at the supply voltage vdd or reference/ground voltage gnd) for the analog voltage feedback signal D.

There are a number of applications where the input signal A for the circuit 10 could be a current instead of a voltage. As an example, consider the use of a photodiode as the signal source generating a photocurrent. In such a case, there is a need for an input stage circuit to convert the photodiode current to a voltage. Known solutions for providing the input stage circuit include, for example, the use of a current integrator (charge amplifier) circuit 40 like that shown in FIG. 2A to convert the current from a photodiode 42 to generate the analog voltage input signal A. The output voltage from the circuit 40 is proportional to the integrated value of the photodiode current (or the total injected charge). Another known solution for the input stage circuit utilizes a source-follower circuit 44 like that shown in FIG. 2B to convert the current from a photodiode 42 to generate the analog voltage input signal A.

A concern with the input stage circuit solutions as shown in FIGS. 2A and 2B is power consumption. If the photodiode 42 and SD-ADC circuit 10 are components of a battery or energy harvested powered device, the input stage circuits 40, 44 will consume a not insignificant amount of power. A need therefore exists in the art for a low power consumption input stage circuit for interfacing the current output from a photodiode 42 to the analog signal input to a SD-ADC circuit 10.

SUMMARY

A sigma-delta analog-to-digital converter circuit comprises: an integrator circuit configured to integrate a difference signal; a single bit quantization circuit configured to quantize an output of the integrator circuit and generate a bit signal; a feedback digital-to-analog converter circuit configured to generate an analog feedback signal from said bit signal; and an input stage circuit configured to combine an analog input signal and the analog feedback signal to generate the difference signal.

In an embodiment, the input stage circuit comprises: an input capacitor having a first terminal and a second terminal coupled to receive said analog feedback signal; a first switch coupled between an analog current signal input (receiving said analog input signal) and the first terminal of the input capacitor, said first switch actuated in response to a first clock signal; a second switch coupled between the first terminal of the input capacitor and a reference node, said second switch actuated in response to a second clock signal; wherein said first and second clock signals are non-overlapping; a third switch coupled between the second terminal of the input capacitor and the reference node, said third switch actuated in response to the first clock signal; and a fourth switch coupled between the second terminal of the input capacitor and an input of the integrator circuit to provide said difference signal, said fourth switch actuated in response to the second clock signal.

The feedback digital-to-analog converter circuit may comprise: a feedback capacitor having a first terminal and a second terminal; a fifth switch coupled between the first terminal and an output of the single bit quantization circuit, said fifth switch actuated in response to the second clock signal; a sixth switch coupled between the first terminal of the feedback capacitor and the reference node, said sixth switch actuated in response to the first clock signal; a seventh switch coupled between the second terminal of the input capacitor and the reference node, said seventh switch actuated in response to the first clock signal; and an eighth switch coupled between the second terminal of the input capacitor and the second terminal of the input capacitor to provide said analog feedback signal, said eighth switch actuated in response to the second clock signal.

In another embodiment, the input stage circuit comprises: an input capacitor having a first terminal and a second terminal; a first switch coupled between an analog current signal input (receiving said analog input signal) and the first terminal of the input capacitor, said first switch actuated in response to a first clock signal; a second switch coupled between the first terminal of the input capacitor and an output of the feedback digital-to-analog converter circuit to receive said analog feedback signal, said second switch actuated in response to a second clock signal; wherein said first and second clock signals are non-overlapping; a third switch coupled between the second terminal of the input capacitor and the reference node, said third switch actuated in response to the first clock signal; and a fourth switch coupled between the second terminal of the input capacitor and an input of the integrator circuit to provide said difference signal, said fourth switch actuated in response to the second clock signal.

The feedback digital-to-analog converter circuit may comprise: a single bit switch configured to apply a first voltage as the analog feedback signal in response to a first logic state of said bit signal and apply a second voltage as the analog feedback signal in response to a second logic state of said bit signal.

In an embodiment, a system comprises: a source of an analog current signal; and a sigma-delta analog-to-digital converter circuit in accordance with the embodiments noted above; wherein said analog current signal is received at said analog current signal input

BRIEF DESCRIPTION OF THE DRAWINGS

For a better understanding of the embodiments, reference will now be made by way of example only to the accompanying figures in which.

DETAILED DESCRIPTION

Figure 3:
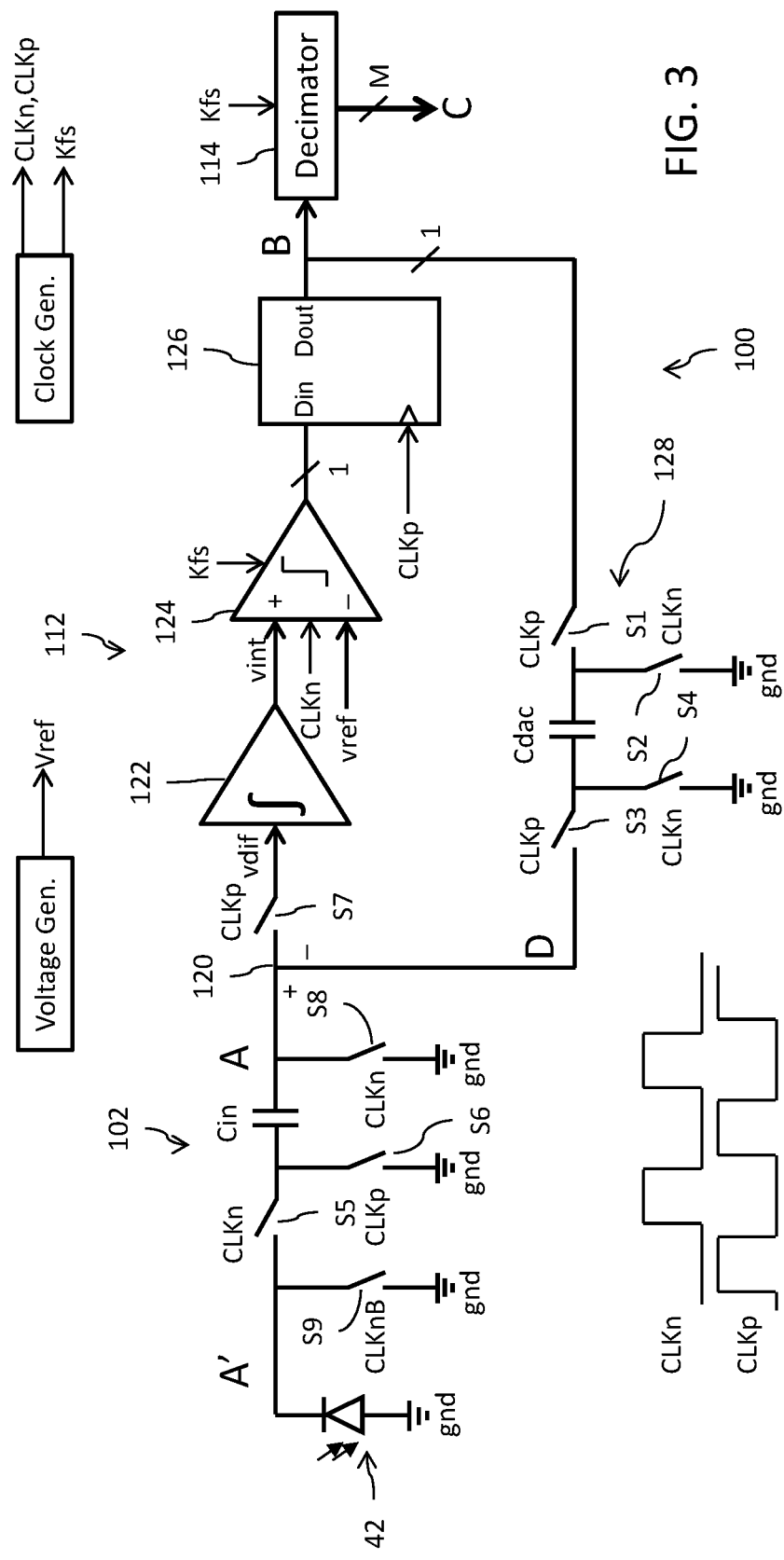
FIG. 3 is a circuit diagram for a sigma-delta analog-to-digital converter circuit having a low power consumption input stage circuit configured to receive an analog current input signal.

Reference is now made to FIG. 3 which shows a circuit diagram for a sigma-delta analog-to-digital converter circuit 100 having a low power consumption input stage circuit 102 configured to receive an analog current input signal A' and output an analog voltage input signal A. As an example which is not to be considered limiting, the analog current input signal A' may be generated by a photodiode 42 as a photocurrent. The circuit 100 includes a sigma-delta modulator circuit 112 (illustrated here as a first-order circuit) having an input configured to receive said analog current input signal A' and an output configured to generate a digital output signal B comprised of a pulse density modulated pulse stream of 1-bit codes. The ratio formed by a count of the number of pulses in the pulse stream of the signal B divided by a total number of samples (set by a sampling clock at a sampling rate Kfs) of the input signal A' over a known time interval represents the instantaneous magnitude of the input signal A'. The circuit 100 further includes a decimator circuit 114 that accumulates and averages the pulses in the pulse stream of the digital output signal B to generate a digital signal C comprised of a stream of multi-bit (M-bit, where M»1) digital words at an output word rate fd, where fd«Kfs, set by a decimation factor.

The first order implementation of the sigma-delta modulator circuit 112 comprises a summing node 120 configured to receive the analog input signal A output from the input stage circuit 102 and an analog feedback signal D from a feedback loop. The summing node 120 outputs an analog voltage difference signal vdif in response to a difference between the analog input signal A and the analog feedback signal D (i.e., vdif(t)=A(t)−D(t)). The analog voltage difference signal vdif is passed by switch S7 to the input of an integrator circuit 122 (a first order loop filter) for integration to generate a change signal vint having a slope and magnitude that is dependent on the sign and magnitude of the analog voltage difference signal vdif. The switch S7 is actuated in response to a clock signal CLKp. A comparator circuit 124 samples the change signal vint in response to a sampling clock at the sampling rate Kfs and compares the voltage of each sample of the change signal vint to a reference voltage signal vref to latch a corresponding single bit at the frequency of a clock signal CLKn. The clock signals CLKn and CLKp have a same frequency but have phases which are non-overlapping. The comparator circuit 124 effectively operates as a single bit quantization circuit for quantizing the change signal vint. The latched single bit is then latched by a D-type flip flop 126 at the frequency of the clock signal CLKp to output a single bit pulse of the digital output signal B (where the single bit has a first logic state if vint≥vref and has a second logic state if vint<vref).

A single bit capacitive digital-to-analog converter (DAC) circuit 128 in the feedback loop then converts the logic state of the digital output signal B to generate the analog voltage feedback signal D. The DAC circuit 128 includes a capacitor Cdac having a first terminal coupled through a switch S1 to the output of the D-type flip flop 126 to receive the digital output signal B. The switch S1 is actuated in response to the clock signal CLKp. The first terminal of the capacitor Cdac is further coupled to a reference/ground voltage gnd through a switch S2. The switch S2 is actuated in response to the clock signal CLKn. The capacitor Cdac further has a second terminal coupled through a switch S3 to the summing node 120 to provide the analog feedback signal D. The switch S3 is actuated in response to the clock signal CLKp. The second terminal of the capacitor Cdac is further coupled to a reference/ground voltage gnd through a switch S4. The switch S4 is actuated in response to the clock signal CLKn.

The input stage circuit 102 comprises a capacitor Cin having a first terminal coupled through a switch S5 to receive the analog current input signal A'. For example, the analog current input signal A' may be generated by the photodiode 42. The switch S5 is actuated in response to the clock signal CLKn. The first terminal of the capacitor Cin is further coupled to the reference/ground voltage gnd through a switch S6. The switch S6 is actuated in response to the clock signal CLKp. The capacitor Cin further has a second terminal at the summing node 120 that is coupled through switch S7 to the input of the integrator circuit 122 to provide the analog difference signal vdif. The switch S7 is actuated in response to the clock signal CLKp. The second terminal of the capacitor Cin is further coupled to the reference/ground voltage gnd through a switch S8. The switch S8 is actuated in response to the clock signal CLKn.

The input node where the analog current input signal A' is received from diode 42 is also coupled to the reference/ground voltage gnd through a switch S9. The switch S9 is actuated in response to the clock signal CLKnB (which is the logical inverse of the clock signal CLKn) for the purpose of resetting the photodiode 42.

Although a first order integration implementation is illustrated in FIG. 3, it will be understood that this is by example only and the circuit 100 may be implemented using any suitable order.

Figure 4A:
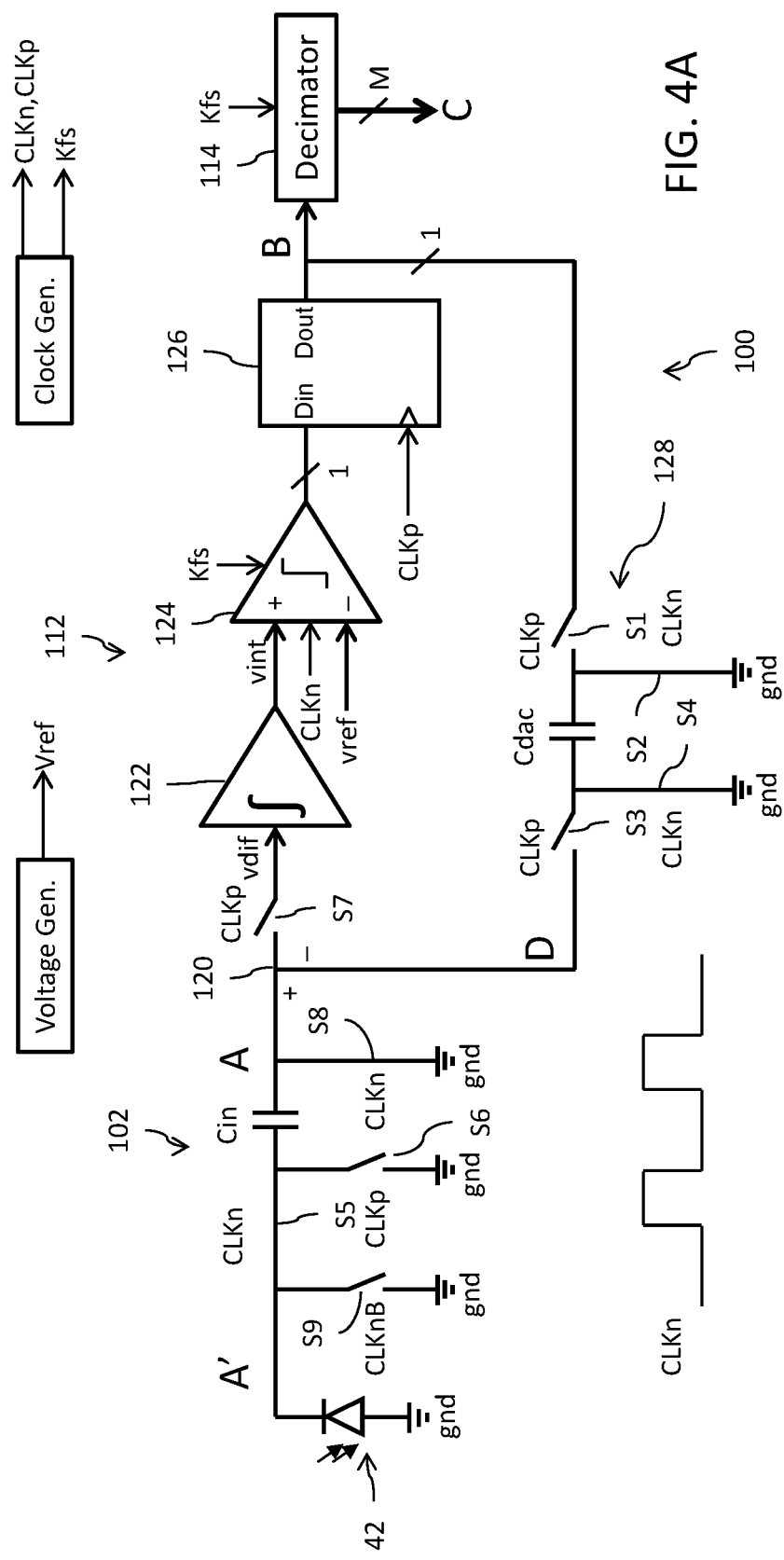
FIGS. 4A and 4B show the open/closed configuration of the switches in FIG. 3 for various phases of the clock signal.
Figure 4B:
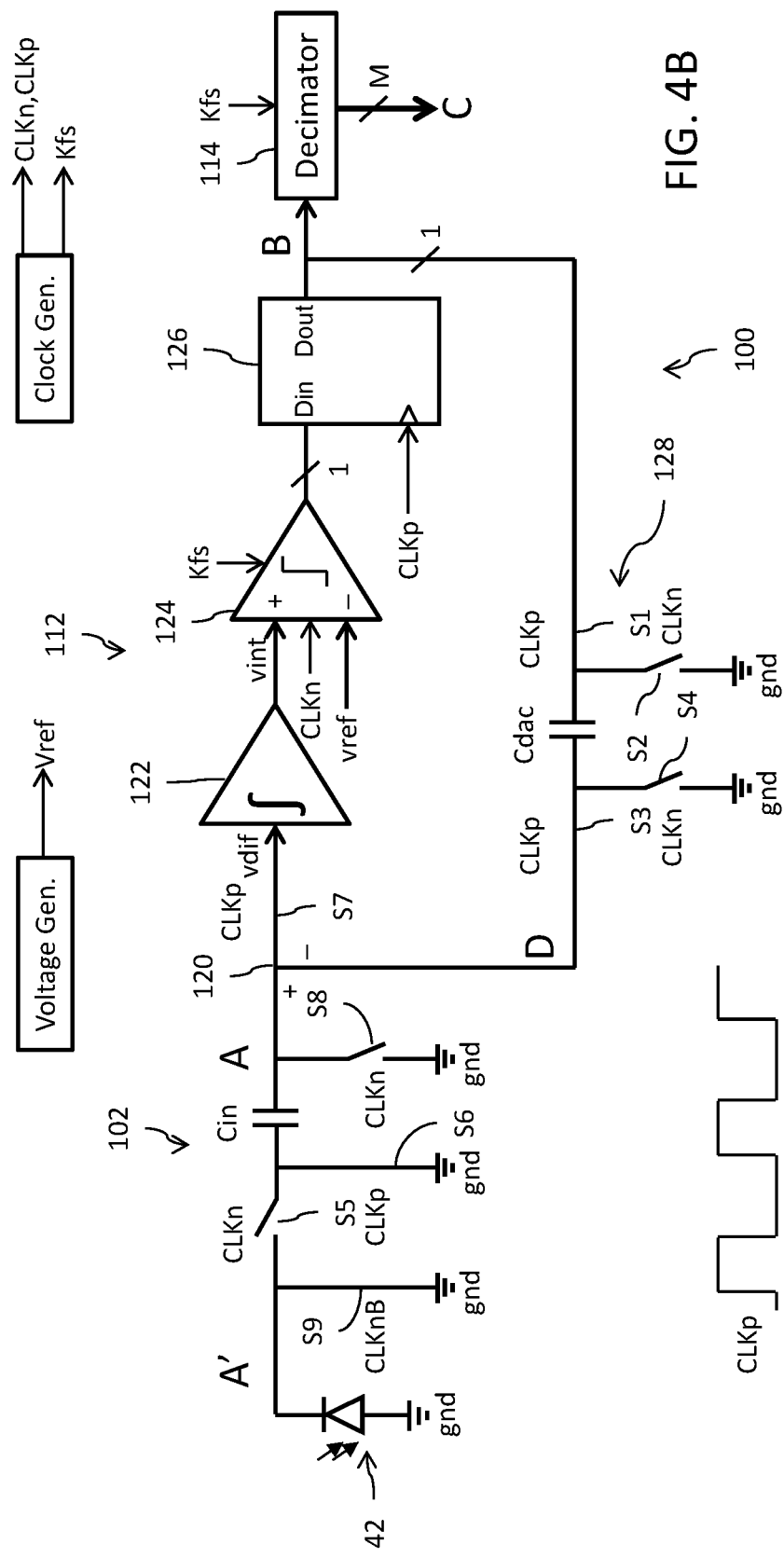

Operation of the circuit 100 may be better understood by reference to FIGS. 4A and 4B, where FIG. 4A shows the open/closed configuration of the switches when the clock signal CLKn is asserted (for example, CLKn=logic 1) and FIG. 4B shows the open/closed configuration of the switches when the clock signal CLKp is asserted (for example, CLKp=logic 1).

FIG. 4A: When the clock signal CLKn is asserted (for example, CLKn=logic 1), switches S2, S4, S5 and S8 are closed (while switches S1, S3, S6, S7 and S9 are open). The capacitor Cdac is discharged to reference/ground voltage gnd through closed switches S2 and S4. Through closed switches S5 and S8, the capacitor Cin is charged in response to the analog current input signal A' to a voltage:

$$V_{Cin} = V_{PD} = \frac{1}{Cpd + Cin} * \int_{t_0}^{t_1} I_{PH}(t) \cdot dt$$

Where: $V_{Cin}$ Wm is the voltage across the capacitor Cin, $V_{PD}$ is the photodiode 42 voltage, Cpd is the capacitance of the photodiode 42, Cin is the capacitance of the capacitor Cin, the difference in time between t0 and t1 is the pulse width for the assertion of the clock signal CLKn, and $I_{PH}$ is the current of the analog current input signal A' from the photodiode 42.

The charge stored by the capacitor Cin is accordingly:

$$Q_{Cin} = Cin * V_{Cin}$$

Note also that with the clock signal CLKn asserted, the comparator circuit 124 will latch the single bit corresponding to the result of the comparison of the sampled the change signal vint to the reference voltage signal vref.

FIG. 4B: When the clock signal CLKp is asserted (for example, CLKp=logic 1), switches S1, S3, S6, and S7 are closed (while switches S2, S4, S5 and S8 are open). The D-type flip flop 126 will latch the single bit output from the comparator circuit 124 for output as the digital output signal B. The capacitor Cdac is coupled by closed switches S1 and S3 in a series circuit between the output of the D-type flip flop 126 and the summing node 120. Through closed switches S6 and S7, the capacitor Cin is coupled to the input of the integrator circuit 122 through the summing node 120.

Assuming a reset (discharge) of the integration capacitor for the integrator circuit 122, the change in charge is:

$$\Delta Q = B * Cdac * vdd - Cin * V_{Cin} \quad \text{Eq(1)}$$

The transfer of charge with respect to the integration capacitor of the integrator circuit 122 is:

$$Vint_{(n)} = Vint_{(n-1)} - \frac{\Delta Q}{Cfb} \quad \text{Eq(2)}$$

Where: n is the current sample time and n−1 is the previous sample time, Vint is the voltage at the output of the integrator circuit 122, and Cfb is the capacitance of the integration capacitor of the integrator circuit 122.

Substituting Eq(1) into Eq(2) gives:

$$Vint_{(n)} = Vint_{(n-1)} - \frac{1}{Cfb} * (B * Cdac * vdd - Cin * V_{Cin})$$

When the digital output signal B is logic high (i.e., B=1), then the voltage at the output of the integrator circuit 122 is:

$$Vint_{(n)} = Vint_{(n-1)} + \frac{Cin}{Cfb} * V_{Cin} - 1 * \frac{Cdac}{Cfb} * vdd$$

$$Vint_{(n)} = Vint_{(n-1)} + \frac{Cin}{Cfb} * V_{Cin} - \frac{Cdac}{Cfb} * vdd$$

When the digital output signal B is logic low (i.e., B=0), the voltage at the output of the integrator circuit 122 is:

$$Vint_{(n)} = Vint_{(n-1)} + \frac{Cin}{Cfb} * V_{Cin} - 0 * \frac{Cdac}{Cfb} * vdd$$

$$Vint_{(n)} = Vint_{(n-1)} + \frac{Cin}{Cfb} * V_{Cin}$$

Note also that concurrent with assertion of the clock signal CLKp (CLKp=logic 1) that the clock signal CLKnB (which is the logical inverse of the clock signal CLKn) is also asserted. In response thereto, the switch S9 is closed. This will discharge the capacitance Cpd of the photodiode 42.

Thus, what will be noted is that when the clock signal CLKp is asserted (for example, CLKp=logic 1), a charge subtraction is performed. In the case where the digital output signal B is logic high (i.e., B=1), charge is transferred to the capacitor Cdac and this charge is subtracted at summing node 120 from the integration capacitor for the integrator circuit 122. As a result, there is a corresponding decrease in the voltage Vint at the output of the integrator circuit 122. Conversely, in the case where the digital output signal B is logic low (i.e., B=0), there is no charge transferred to the capacitor Cdac and the charge from the capacitor Cin is added at summing node 120 to the integration capacitor for the integrator circuit 122. As a result, there is a corresponding increase in the voltage Vint at the output of the integrator circuit 122.

Figure 5A:
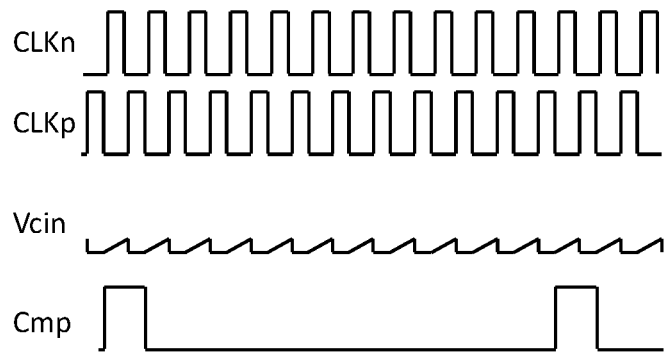
FIGS. 5A, 5B and 5C which illustrate timing diagrams for operation of the circuit of FIG. 3 in response to different magnitudes of the analog current input.
Figure 5B:
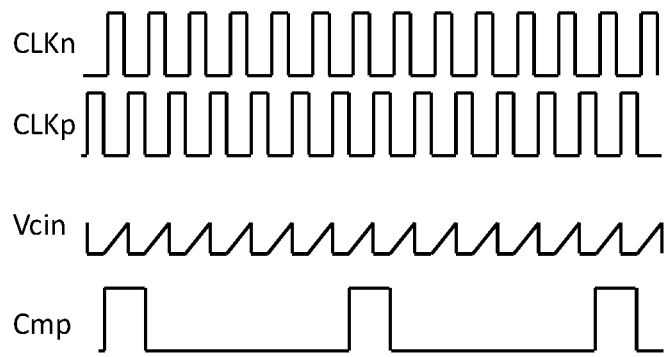
Figure 5C:
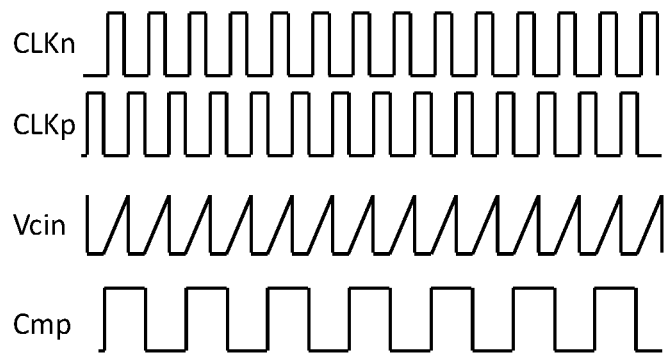

Reference is now made to FIGS. 5A, 5B and 5C which illustrate timing diagrams for operation of the circuit 100 in response to different magnitudes of the analog current input signal A'. FIG. 5A shows operation in response to the analog current input signal A' having a first current magnitude, FIG. 5B shows operation in response to the analog current input signal A' having a second current magnitude greater than the first current magnitude, and FIG. 5C shows operation in response to the analog current input signal A' having a third current magnitude greater than the second current magnitude. It will be noted with respect to the use of the photodiode 42 that as the irradiance increases so does the magnitude of the analog current input signal A'. The increase in analog current input signal A' magnitude causes a corresponding increase in the voltage $V_{Cin}$ across the capacitor Cin. The greater the voltage $V_{Cin}$ the more logic 1 bits in the signal Cmp output from the comparator 124, and thus the more logic 1 bits in the digital output signal B. So, the average comparator 124 output voltage is proportional to the analog current input signal A' magnitude.

A potential disadvantage of the FIG. 3 circuit 100 is that the capacitor Cdac is large and can occupy a significant amount of circuit area. Furthermore, there is a need to perform matching with response to the capacitor Cdac.

Figure 6:
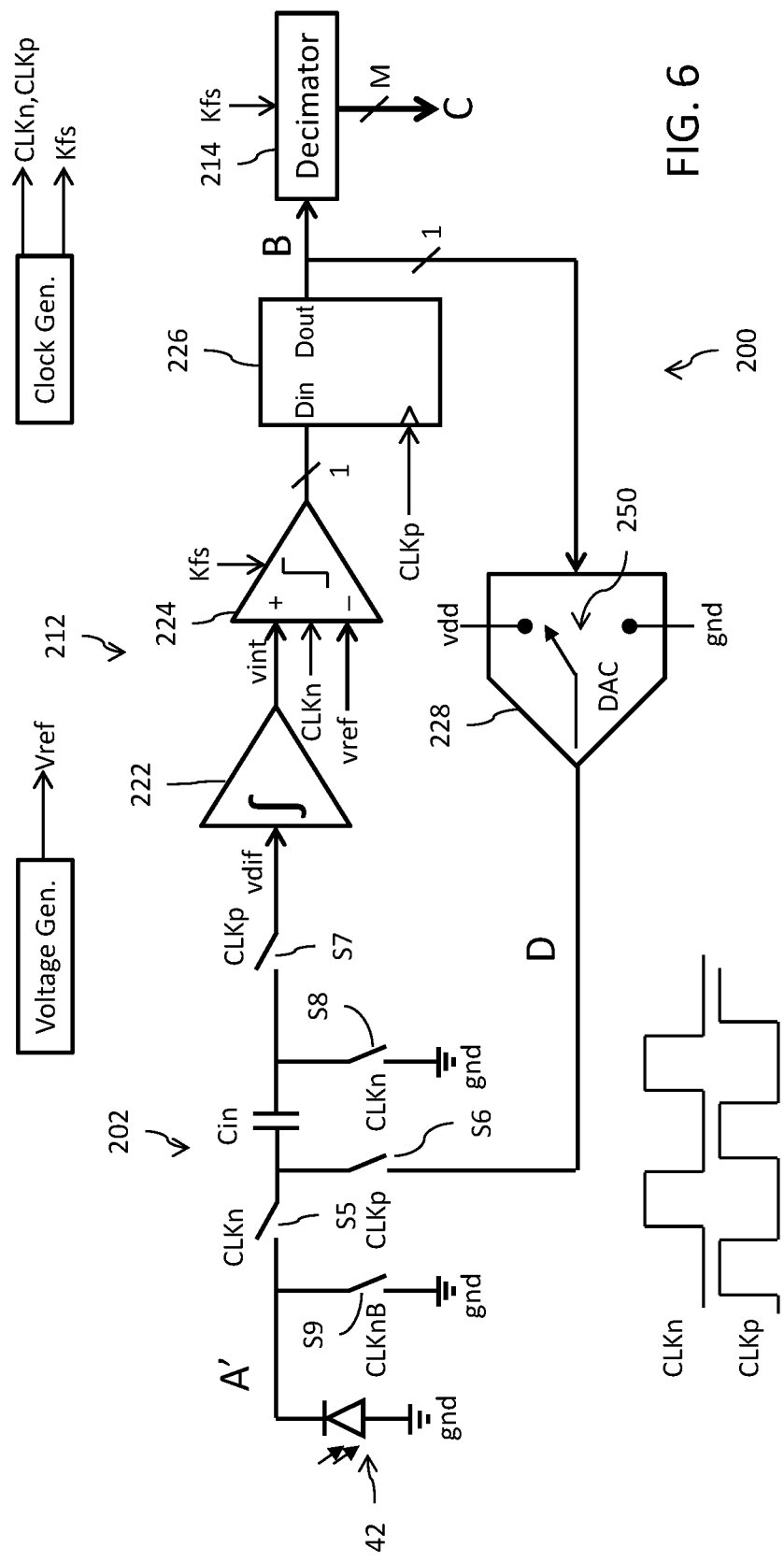
FIG. 6 is a circuit diagram for an alternative embodiment of the sigma-delta analog-to-digital converter circuit.

Reference is now made to FIG. 6 which shows a circuit diagram for an alternative embodiment for a sigma-delta analog-to-digital converter circuit 200 having a low power consumption input stage circuit 202 configured to receive an analog current input signal A'. As an example which is not to be considered limiting, the analog current input signal A' may be generated by a photodiode 42. The circuit 200 includes a sigma-delta modulator circuit 212 (illustrated here as a first-order circuit) having an input configured to receive an analog current input signal A' and an output configured to generate a digital output signal B comprised of a pulse density modulated pulse stream of 1-bit codes. The ratio formed by a count of the number of pulses in the pulse stream of the signal B divided by a total number of samples (set by a sampling clock at a sampling rate Kfs) of the input signal A' over a known time interval represents the instantaneous magnitude of the input signal A'. The circuit 200 further includes a decimator circuit 214 that accumulates and averages the pulses in the pulse stream of the digital output signal B to generate a digital signal C comprised of a stream of multi-bit (M-bit, where M»1) digital words at an output word rate fd, where fd«Kfs, set by a decimation factor.

The first order implementation of the sigma-delta modulator circuit 212 generates an analog voltage difference signal vdif responsive to a difference between the input signal A' and the analog feedback signal D from a feedback loop. The analog voltage difference signal vdif is passed to the input of an integrator circuit 222 (a first order loop filter) by switch S7 for integration to generate a change signal vint having a slope and magnitude that is dependent on the sign and magnitude of the analog voltage difference signal vdif. The switch S7 is actuated in response to a clock signal CLKp. A comparator circuit 224 samples the change signal vint in response to a sampling clock at the sampling rate Kfs and compares the voltage of each sample of the change signal vint to a reference voltage signal vref to latch a corresponding single bit at the frequency of a clock signal CLKn. The clock signals CLKn and CLKp have a same frequency but have phases which are non-overlapping. The comparator circuit 224 effectively operates as a single bit quantization circuit for quantizing the change signal vint. The latched single bit is then latched by a D-type flip flop 226 at the frequency of the clock signal CLKp to output a single bit pulse of the digital output signal B (where the single bit has a first logic state if vint≥vref and has a second logic state if vint<vref).

A single bit digital-to-analog converter (DAC) circuit 228 in the feedback loop then converts the logic state of the digital output signal B to a corresponding analog voltage signal level (at the supply voltage vdd or reference/ground voltage gnd) for the analog voltage feedback signal D. More specifically, the circuit 228 comprises a single bit switch 250 configured to apply a first voltage (for example, the supply voltage vdd) as the analog feedback signal in response to a first logic state of the digital output signal B and apply a second voltage (for example, the reference/ground voltage gnd) as the analog feedback signal in response to a second logic state of digital output signal B.

The input stage circuit 202 comprises a capacitor Cin having a first terminal coupled through a switch S5 to receive the analog current input signal A'. For example, the analog current input signal A' may be generated by the photodiode 42. The switch S5 is actuated in response to the clock signal CLKn. The first terminal of the capacitor Cin is further coupled through a switch S6 to receive the analog voltage feedback signal D from the DAC circuit 228. The switch S6 is actuated in response to the clock signal CLKp. The capacitor Cin further has a second terminal that is coupled through switch S7 to the input of the integrator circuit 222 to provide the analog difference signal vdif. The switch S7 is actuated in response to the clock signal CLKp. The second terminal of the capacitor Cin is further coupled to the reference/ground voltage gnd through a switch S8. The switch S8 is actuated in response to the clock signal CLKn.

The input node where the analog current input signal A' is received from diode 42 is also coupled to the reference/ground voltage gnd through a switch S9. The switch S9 is actuated in response to the clock signal CLKnB (which is the logical inverse of the clock signal CLKn) for the purpose of resetting the photodiode 42.

An advantage of the FIG. 6 circuit 200 over the FIG. 3 circuit 100 is that it does not need to use the capacitor Cdac.

Although a first order implementation is illustrated in FIG. 6, it will be understood that this is by example only and the circuit 100 may be implemented using any suitable order.

Figure 7A:
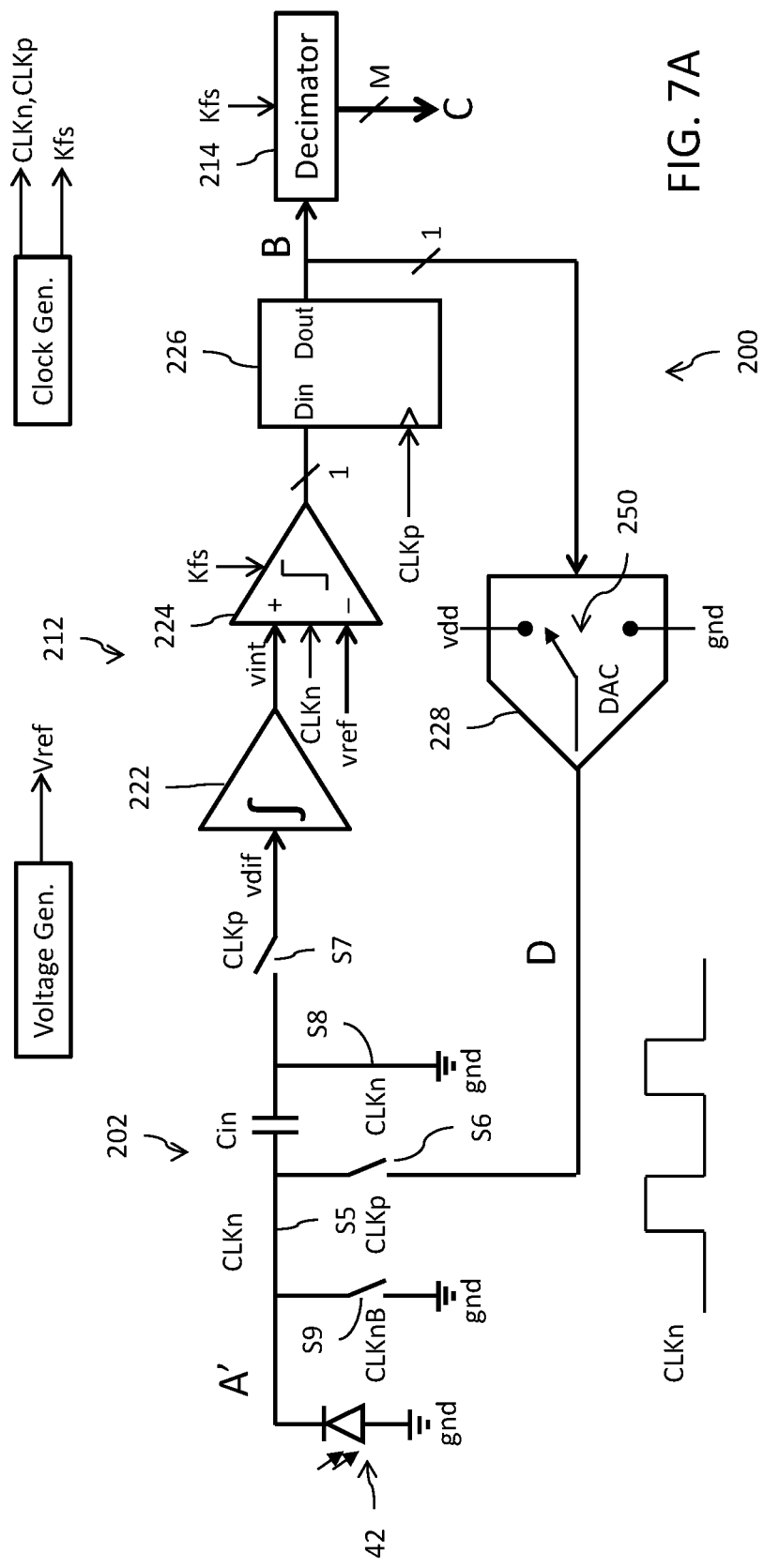
FIGS. 7A and 7B show the open/closed configuration of the switches in FIG. 3 for various phases of the clock signal.
Figure 7B:
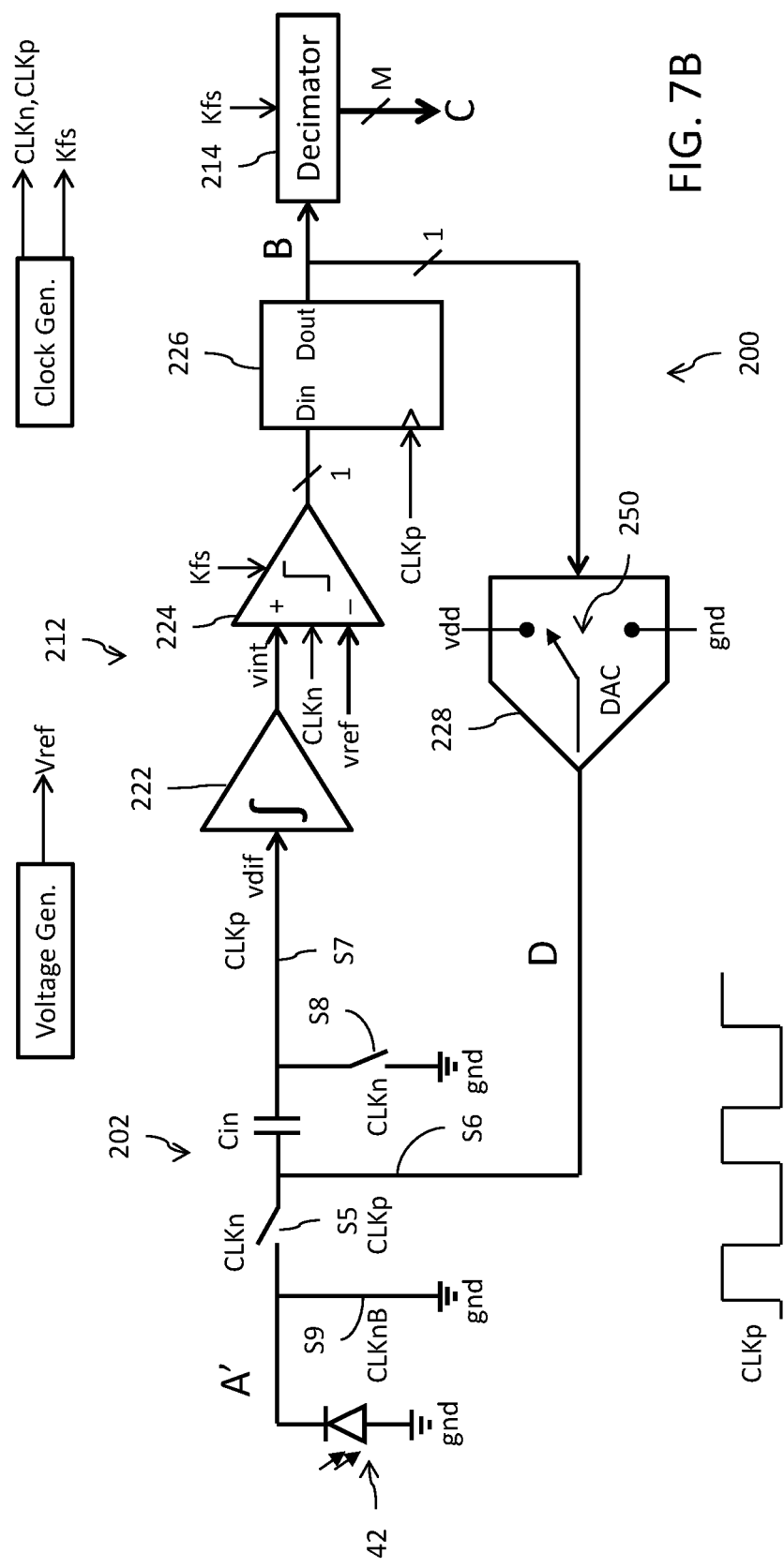

Operation of the circuit 200 may be better understood by reference to FIGS. 7A and 7B, where FIG. 7A shows the open/closed configuration of the switches when the clock signal CLKn is asserted (for example, CLKn=logic 1) and FIG. 7B shows the open/closed configuration of the switches when the clock signal CLKp is asserted (for example, CLKp=logic 1).

FIG. 7A: When the clock signal CLKn is asserted (for example, CLKn=logic 1), switches S5 and S8 are closed (while switches S6, S7 and S9 are open). The analog voltage feedback signal D is disconnected from the input stage circuit 202 through switch S6. The capacitor Cin is charged through closed switches S5 and S8 in response to the analog current input signal A' to a voltage:

$$V_{Cin} = V_{PD} = \frac{1}{Cpd + Cin} * \int_{t_0}^{t_1} I_{PH}(t) \cdot dt$$

Where: $V_{Cin}$ is the voltage across the capacitor Cin, $V_{PD}$ is the photodiode 42 voltage, Cpd is the capacitance of the photodiode 42, Cin is the capacitance of the capacitor Cin, the difference in time between t0 and t1 is the pulse width for the assertion of the clock signal CLKn, and $I_{PH}$ is the current of the analog current input signal A' from photodiode 42.

The charge stored by the capacitor Cin is accordingly:

$$Q_{Cin} = Cin * V_{Cin}$$

Note also that with the clock signal CLKn asserted, the comparator circuit 224 will latch the single bit corresponding to the comparison of the sampled the change signal vint to the to the reference voltage signal vref.

FIG. 7B: When the clock signal CLKp is asserted (for example, CLKp=logic 1), switches S6 and S7 are closed (while switches S5 and S8 are open). The D-type flip flop 226 will latch the single bit output from the comparator circuit 224 for output as the digital output signal B. The single bit digital-to-analog converter (DAC) circuit 228 will switch the analog voltage feedback signal D between an analog voltage at the supply voltage vdd level or the reference/ground voltage gnd level dependent on the logic state of the digital output signal B. The input of the integrator circuit 222 is further coupled to the capacitor Cin through closed switch S7.

Assuming a reset (discharge) of the integration capacitor for the integrator circuit 222, the change in charge is:

$$\Delta Q = Cin*(B*vdd - V_{Cin}) \quad \text{Eq(3)}$$

The transfer of charge with respect to the integration capacitor of the integrator circuit 222 is:

$$Vint_{(n)} = Vint_{(n-1)} - \frac{\Delta Q}{Cfb} \quad \text{Eq(4)}$$

Where: n is the current sample time and n−1 is the previous sample time, Vint is the voltage at the output of the integrator circuit 222, and Cfb is the capacitance of the integration capacitor of the integrator circuit 222.

Substituting Eq(3) into Eq(4) gives:

$$Vint_{(n)} = Vint_{(n-1)} - \frac{1}{Cfb} * (Cin * (B * vdd - V_{Cin}))$$

When the digital output signal B is logic high (i.e., B=1), the voltage at the output of the integrator circuit 122 is:

$$Vint_{(n)} = Vint_{(n-1)} + \frac{Cin}{Cfb} * V_{Cin} - 1 * \frac{Cin}{Cfb} * vdd$$

$$Vint_{(n)} = Vint_{(n-1)} + \frac{Cin}{Cfb} * V_{Cin} - \frac{Cin}{Cfb} * vdd$$

When the digital output signal B is logic low (i.e., B=0), the voltage at the output of the integrator circuit 122 is:

$$Vint_{(n)} = Vint_{(n-1)} + \frac{Cin}{Cfb} * V_{Cin} - 0 * \frac{Cin}{Cfb} * vdd$$

$$Vint_{(n)} = Vint_{(n-1)} + \frac{Cin}{Cfb} * V_{Cin}$$

Note also that concurrent with assertion of the clock signal CLKp (CLKp=logic 1) that the clock signal CLKnB (which is the logical inverse of the clock signal CLKn) is also asserted. In response thereto, the switch S9 is closed. This will discharge the capacitance Cpd of the photodiode 42.

Thus, what will be noted is that when the clock signal CLKp is asserted (for example, CLKp=logic 1), a charge subtraction is performed. In the case where the digital output signal B is logic high (i.e., B=1), charge is supplied by the DAC circuit 228 and this charge is subtracted from the integration capacitor for the integrator circuit 222. As a result, there is a corresponding decrease in the voltage Vint at the output of the integrator circuit 222. Conversely, in the case where the digital output signal B is logic low (i.e., B=0), there is no charge supplied by the DAC circuit 228 and the charge from the capacitor Cin is added to the integration capacitor for the integrator circuit 222. As a result, there is a corresponding increase in the voltage Vint at the output of the integrator circuit 222.

Figure 8:
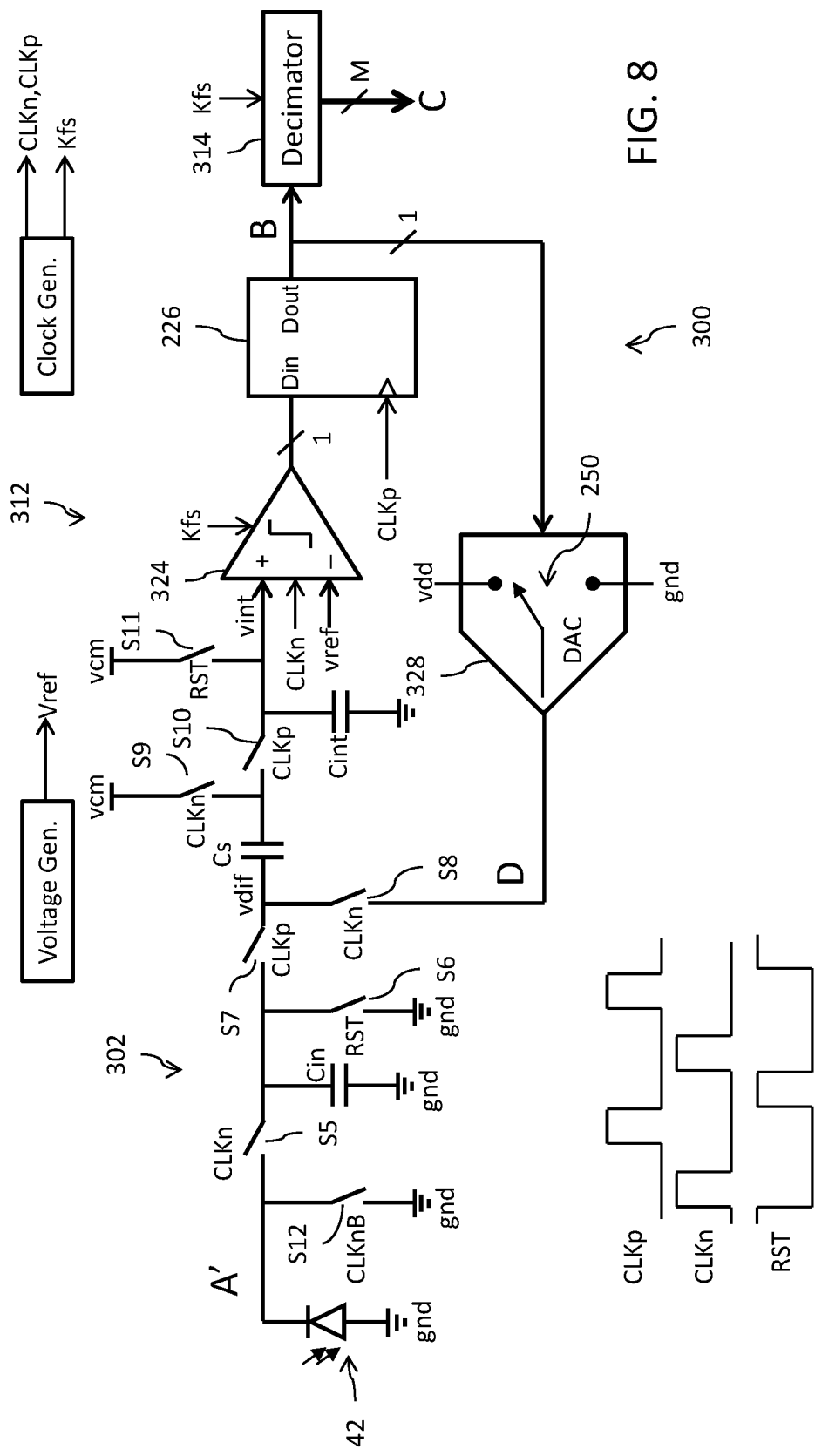
FIG. 8 is a circuit diagram for an alternative embodiment of the sigma-delta analog-to-digital converter circuit.

Reference is now made to FIG. 8 which shows a circuit diagram for an alternative embodiment for a sigma-delta analog-to-digital converter circuit 300 having a low power consumption input stage circuit 302 configured to receive an analog current input signal A'. As an example which is not to be considered limiting, the analog current input signal A' may be generated by a photodiode 42. The circuit 300 includes a sigma-delta modulator circuit 312 (illustrated here as a first-order circuit) having an input configured to receive an analog current input signal A' and an output configured to generate a digital output signal B comprised of a pulse density modulated pulse stream of 1-bit codes. The ratio formed by a count of the number of pulses in the pulse stream of the signal B divided by a total number of samples (set by a sampling clock at a sampling rate Kfs) of the input signal A' over a known time interval represents the instantaneous magnitude of the input signal A'. The circuit 300 further includes a decimator circuit 314 that accumulates and averages the pulses in the pulse stream of the digital output signal B to generate a digital signal C comprised of a stream of multi-bit (M-bit, where M»1) digital words at an output word rate fd, where fd«Kfs, set by a decimation factor.

The first order implementation of the sigma-delta modulator circuit 312 generates an analog voltage difference signal vdif responsive to a difference between the input signal A' and the analog feedback signal D from a feedback loop. The analog voltage difference signal vdif is passed to the input of a passive integrator circuit 322 (a first order loop filter) for integration to generate a change signal vint having a slope and magnitude that is dependent on the sign and magnitude of the analog voltage difference signal vdif. A comparator circuit 324 samples the change signal vint in response to a sampling clock at the sampling rate Kfs and compares the voltage of each sample of the change signal vint to a reference voltage signal vref to latch a corresponding single bit at the frequency of a clock signal CLKn. The comparator circuit 324 effectively operates as a single bit quantization circuit for quantizing the change signal vint. The latched single bit is then latched by a D-type flip flop 226 at the frequency of the clock signal CLKp to output a single bit pulse of the digital output signal B (where the single bit has a first logic state if vint≥vref and has a second logic state if vint<vref). The clock signals CLKn and CLKp have a same frequency but have phases which are non-overlapping.

A single bit digital-to-analog converter (DAC) circuit 328 in the feedback loop then converts the logic state of the digital output signal B to a corresponding analog voltage signal level (at the supply voltage vdd or reference/ground voltage gnd) for the analog voltage feedback signal D. More specifically, the circuit 328 comprises a single bit switch 250 configured to apply a first voltage (for example, the supply voltage vdd) as the analog feedback signal in response to a first logic state of the digital output signal B and apply a second voltage (for example, the reference/ground voltage gnd) as the analog feedback signal in response to a second logic state of digital output signal B.

The input stage circuit 302 comprises a capacitor Cin having a first terminal coupled through a switch S5 to receive the analog current input signal A'. For example, the analog current input signal A' may be generated by the photodiode 42. The switch S5 is actuated in response to the clock signal CLKn. The capacitor Cin further has a second terminal that is coupled to a reference/ground voltage gnd. The first terminal of the capacitor Cin is further coupled to the reference/ground voltage gnd through a switch S6. The switch S6 is actuated in response to a reset signal RST. The clock signals CLKn and CLKp and the reset signal RST have a same frequency but have phases which are non-overlapping.

The passive integrator circuit 322 comprises a capacitor Cs having a first terminal coupled through a switch S7 to the first terminal of the capacitor Cin. The switch S7 is actuated in response to the clock signal CLKp. The first terminal of capacitor Cs is further coupled to receive the analog voltage feedback signal D from the DAC circuit 228 through a switch S8. The switch S8 is actuated in response to the clock signal CLKn. The capacitor Cs further has a second terminal that is coupled through switch S9 to a common mode voltage vcm. The switch S9 is actuated in response to the clock signal CLKn.

The passive integrator circuit 322 further comprises a capacitor Cint having a first terminal coupled through a switch S10 to the second terminal of the capacitor Cs. The switch S10 is actuated in response to the clock signal CLKp. A second terminal of capacitor Cint is coupled to a reference/ground voltage gnd. The first terminal of capacitor Cint is further coupled through switch S11 to the common mode voltage vcm, and is further coupled to the non-inverting input of the comparator 324. The switch S11 is actuated in response to the reset signal RST.

The input node where the analog current input signal A' is received from diode 42 is also coupled to the reference/ground voltage gnd through a switch S12. The switch S12 is actuated in response to the clock signal CLKnB (which is the logical inverse of the clock signal CLKn) for the purpose of resetting the photodiode 42.

Operation of the circuit 300 is similar to the operation of the circuit 200 described above.

Figure 1:
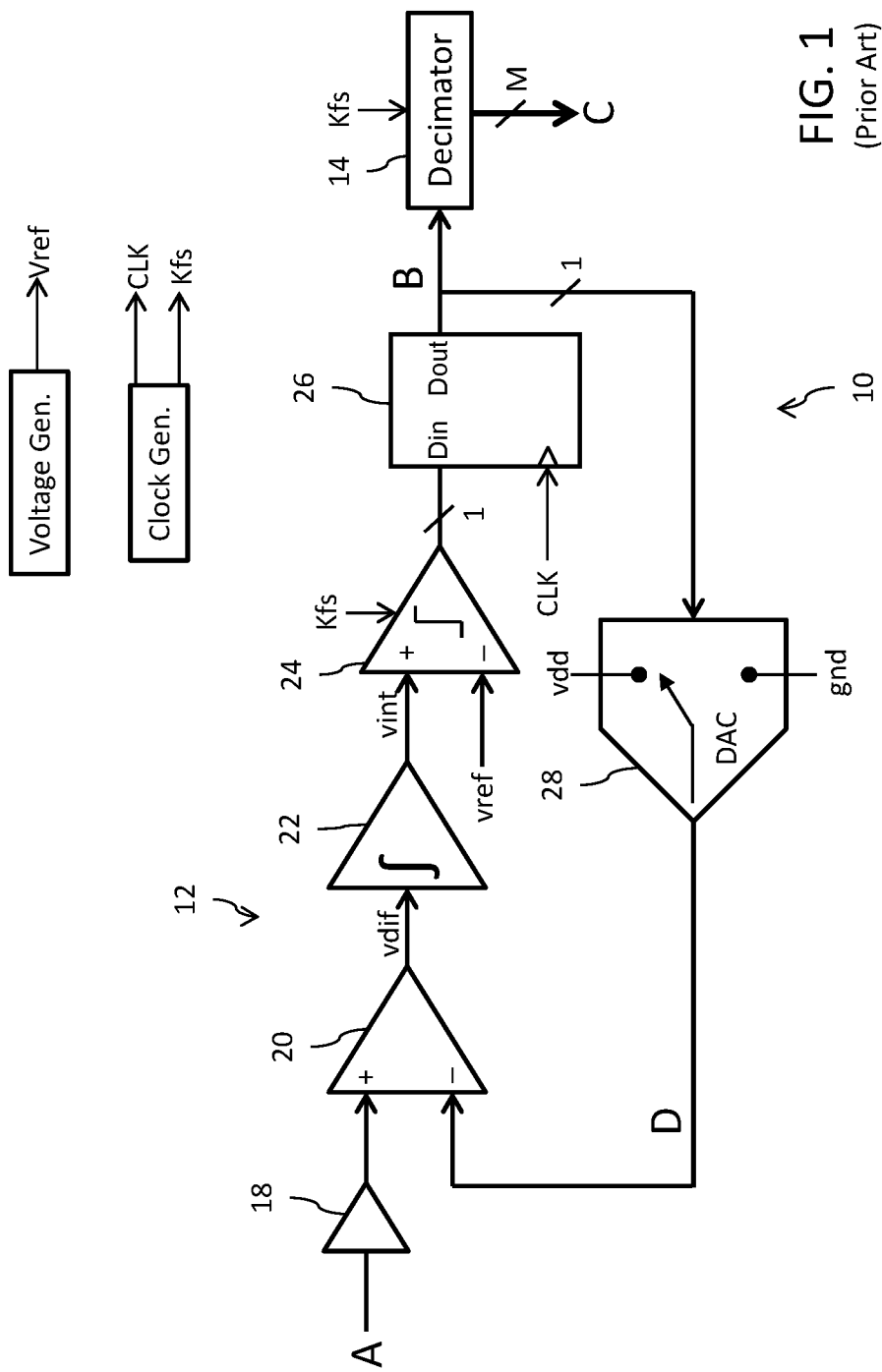
FIG. 1 is a time domain block diagram of a conventional sigma-delta analog-to-digital converter circuit.
Figure 2A:
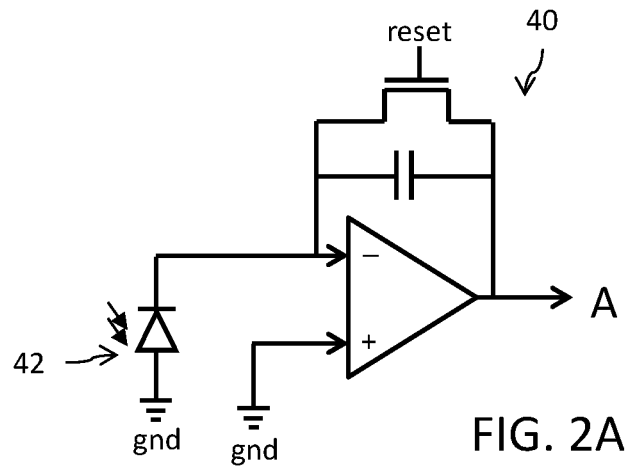
FIGS. 2A and 2B shown circuit diagrams for known input stage circuits.
Figure 2B:
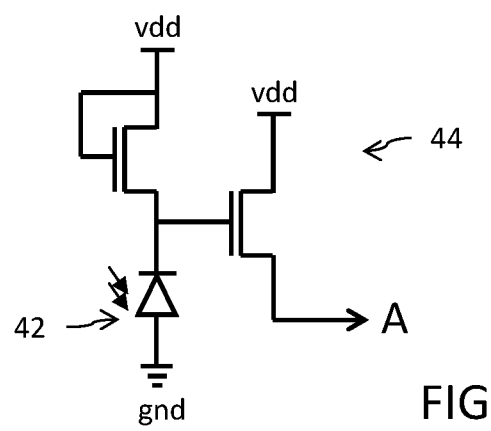
Figure 9:
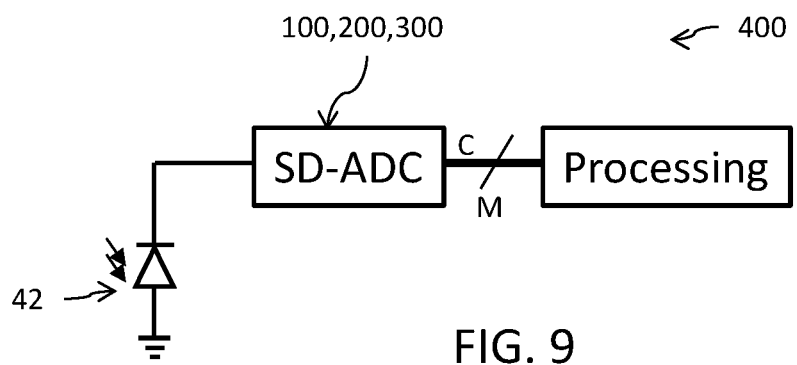
FIG. 9 is a block diagram showing use of the sigma-delta analog-to-digital converter circuit in a system.

Reference is now made to FIG. 9 which shows a block diagram of a system 400. The system may use the sigma-delta analog-to-digital converter circuit 100, 200, 300 for converting an analog current input signal A' to generate a digital signal C that is further processed. One application is for an ambient light sensor (ALS) where the photodiode 42 is used to receive ambient light and the digital signal C is a measure of the ambient light condition. Another application is for an energy harvesting ambient light sensor where energy from the photodiode current is harvested.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit including a sigma-delta analog-to-digital converter circuit, comprising:
    an integrator circuit configured to integrate a difference signal;
    a single bit quantization circuit configured to quantize an output of the integrator circuit and generate a bit signal;
    a feedback digital-to-analog converter circuit configured to generate an analog feedback signal from said bit signal; and
    an input stage circuit comprising:
        an input capacitor having a first terminal and further having a second terminal coupled to receive said analog feedback signal;
        a first switch coupled between an analog current signal input and the first terminal of the input capacitor, said first switch actuated in response to a first clock signal;
        a second switch coupled between the first terminal of the input capacitor and a reference node, said second switch actuated in response to a second clock signal;
        wherein said first and second clock signals are non-overlapping;
        a third switch coupled between the second terminal of the input capacitor and the reference node, said third switch actuated in response to the first clock signal; and
        a fourth switch coupled between the second terminal of the input capacitor and an input of the integrator circuit to provide said difference signal, said fourth switch actuated in response to the second clock signal; and
        wherein said analog current signal input is configured to receive a photocurrent generated by a photodiode, and further comprising a fifth switch coupled between the analog current signal input and the reference node, said fifth switch actuated to reset said photodiode.

2. The circuit of claim 1, wherein said fifth switch is actuated in response to a logical inversion of the first clock signal.

3. The circuit of claim 1, wherein said single bit quantization circuit is configured to latch said bit signal in response to the first clock signal.

4. The circuit of claim 3, further comprising a flip flop circuit configured to latch an output of the single bit quantization circuit in response to the second clock signal, wherein an output of the flip flop circuit is coupled to an input of the feedback digital-to-analog converter circuit.

5. A circuit including a sigma-delta analog-to-digital converter circuit, comprising:
    an integrator circuit configured to integrate a difference signal;
    a single bit quantization circuit configured to quantize an output of the integrator circuit and generate a bit signal;
    a feedback digital-to-analog converter circuit configured to generate an analog feedback signal from said bit signal; and
    an input stage circuit comprising:
        an input capacitor having a first terminal and further having a second terminal coupled to receive said analog feedback signal;
        a first switch coupled between an analog current signal input and the first terminal of the input capacitor, said first switch actuated in response to a first clock signal;
        a second switch coupled between the first terminal of the input capacitor and a reference node, said second switch actuated in response to a second clock signal;
        wherein said first and second clock signals are non-overlapping;

a third switch coupled between the second terminal of the input capacitor and the reference node, said third switch actuated in response to the first clock signal; and a fourth switch coupled between the second terminal of the input capacitor and an input of the integrator circuit to provide said difference signal, said fourth switch actuated in response to the second clock signal;

wherein said feedback digital-to-analog converter circuit comprises:

a feedback capacitor having a first terminal and a second terminal;

a fifth switch coupled between the first terminal and an output of the single bit quantization circuit, said fifth switch actuated in response to the second clock signal;

a sixth switch coupled between the first terminal of the feedback capacitor and the reference node, said sixth switch actuated in response to the first clock signal;

a seventh switch coupled between the second terminal of the feedback capacitor and the reference node, said seventh switch actuated in response to the first clock signal; and an eighth switch coupled between the second terminal of the feedback capacitor and the second terminal of the input capacitor, said eighth switch actuated in response to the second clock signal.

6. The circuit of claim 1, further comprising a decimator circuit configured to receive and decimate said bit signal.

7. The circuit of claim 1, further comprising:
a source of an analog current signal; and
wherein said analog current signal is received at said analog current signal input.

8. The circuit of claim 7, wherein said source is a photodiode and the analog current signal is a photocurrent, and wherein the circuit is configured to operate as one of an ambient light detector and an energy harvesting system.

9. A circuit including a sigma-delta analog-to-digital converter circuit, comprising:
an integrator circuit configured to integrate a difference signal;
a single bit quantization circuit configured to quantize an output of the integrator circuit and generate a bit signal;
a feedback digital-to-analog converter circuit configured to generate an analog feedback signal from said bit signal; and
an input stage circuit comprising:
an input capacitor having a first terminal and a second terminal;
a first switch coupled between an analog current signal input and the first terminal of the input capacitor, said first switch actuated in response to a first clock signal;
a second switch coupled between the first terminal of the input capacitor and an output of the feedback digital-to-analog converter circuit to receive said analog feedback signal, said second switch actuated in response to a second clock signal;
wherein said first and second clock signals are non-overlapping;
a third switch coupled between the second terminal of the input capacitor and a reference node, said third switch actuated in response to the first clock signal; and
a fourth switch coupled between the second terminal of the input capacitor and an input of the integrator circuit to provide said difference signal, said fourth switch actuated in response to the second clock signal; and wherein said analog current signal input is configured to receive a photocurrent generated by a photodiode, and further comprising a fifth switch coupled between the analog current signal input and the reference node, said fifth switch actuated to reset said photodiode.

10. The circuit of claim 9, wherein said fifth switch is actuated in response to a logical inversion of the first clock signal.

11. The circuit of claim 9, wherein said single bit quantization circuit is configured to latch said bit signal in response to the first clock signal.

12. The circuit of claim 11, further comprising a flip flop circuit configured to latch an output of the single bit quantization circuit in response to the second clock signal, wherein an output of the flip flop circuit is coupled to an input of the feedback digital-to-analog converter circuit.

13. The circuit of claim 9, wherein said feedback digital-to-analog converter circuit comprises:
a single bit switch configured to apply a first voltage as the analog feedback signal in response to a first logic state of said bit signal and apply a second voltage as the analog feedback signal in response to a second logic state of said bit signal.

14. The circuit of claim 9, further comprising a decimator circuit configured to receive and decimate said bit signal.

15. The circuit of claim 9, further comprising:
a source of an analog current signal; and
wherein said analog current signal is received at said analog current signal input.

16. The circuit of claim 15, wherein said source is a photodiode and the analog current signal is a photocurrent, and wherein said circuit is configured to operate as one of an ambient light detector and an energy harvesting system.

17. A circuit including a sigma-delta analog-to-digital converter circuit, comprising:
an integrator circuit configured to integrate a difference signal;
a single bit quantization circuit configured to quantize an output of the integrator circuit and generate a bit signal;
a feedback digital-to-analog converter circuit configured to generate an analog feedback signal from said bit signal; and
an input stage circuit comprising:
an input capacitor having a first terminal and a second terminal, wherein the second terminal is coupled to a reference node;
a first switch coupled between an analog current signal input and the first terminal of the input capacitor, said first switch actuated in response to a first clock signal;
a second switch coupled between the first terminal of the input capacitor and the reference node, said second switch actuated in response to a reset signal;
a third switch coupled between the first terminal of the input capacitor and an input of the integrator circuit, said third switch actuated in response to a second clock signal;
wherein said first and second clock signals and said reset signal are non-overlapping; and
a fourth switch coupled between an output of the feedback digital-to-analog converter circuit to receive said analog feedback signal and the input of the integrator circuit, said fourth switch actuated in response to the first clock signal.

18. The circuit of claim 17, wherein said analog current signal input is configured to receive a photocurrent generated by a photodiode, and further comprising a fifth switch coupled between the analog current signal input and the reference node, said fifth switch actuated in response to a logical inversion of the first clock signal to reset said photodiode.

19. The circuit of claim 17, wherein said single bit quantization circuit is configured to latch said bit signal in response to the first clock signal.

20. The circuit of claim 19, further comprising a flip flop circuit configured to latch an output of the single bit quantization circuit in response to the second clock signal, wherein an output of the flip flop circuit is coupled to an input of the feedback digital-to-analog converter circuit.

21. The circuit of claim 17, wherein said feedback digital-to-analog converter circuit comprises:
a single bit switch configured to apply a first voltage as the analog feedback signal in response to a first logic state of said bit signal and apply a second voltage as the analog feedback signal in response to a second logic state of said bit signal.

22. The circuit of claim 17, further comprising a decimator circuit configured to receive and decimate said bit signal.

23. The circuit of claim 17, wherein said integrator circuit comprises:
a first capacitor having a first terminal coupled to the input of the integrator circuit and a second terminal;
a sixth switch coupled between the second terminal of the first capacitor and a common mode voltage node, said sixth switch actuated in response to the first signal;
a second capacitor having a first terminal and a second terminal, wherein the first terminal is coupled to an input of the single bit quantization circuit and the second terminal is coupled to the reference node;
a seventh switch coupled between the second terminal of the first capacitor and the first terminal of the second capacitor, said seventh switch actuated in response to the second signal; and
an eighth switch coupled between the first terminal of the second capacitor and the common mode voltage node, said eighth switch actuated in response to the reset signal.

24. The circuit of claim 5, wherein said analog current signal input is configured to receive a photocurrent generated by a photodiode, and further comprising a fifth switch coupled between the analog current signal input and the reference node, said fifth switch actuated in response to a logical inversion of the first clock signal to reset said photodiode.

25. The circuit of claim 5, wherein said single bit quantization circuit is configured to latch said bit signal in response to the first clock signal.

26. The circuit of claim 25, further comprising a flip flop circuit configured to latch an output of the single bit quantization circuit in response to the second clock signal, wherein an output of the flip flop circuit is coupled to an input of the feedback digital-to-analog converter circuit.

27. The circuit of claim 5, further comprising a decimator circuit configured to receive and decimate said bit signal.

28. The circuit of claim 5, further comprising:
a source of an analog current signal; and
wherein said analog current signal is received at said analog current signal input.

29. The circuit of claim 28, wherein said source is a photodiode and the analog current signal is a photocurrent, and wherein the circuit is configured to operate as one of an ambient light detector and an energy harvesting system.

* * * * *